(12) United States Patent
Mitani et al.

(10) Patent No.: US 7,979,038 B2
(45) Date of Patent: Jul. 12, 2011

(54) PLL MODULATION CIRCUIT, RADIO TRANSMISSION DEVICE, AND RADIO COMMUNICATION DEVICE

(75) Inventors: Yosuke Mitani, Tokyo (JP); Shunsuke Hirano, Kanagawa (JP); Kaoru Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 481 days.

(21) Appl. No.: 12/160,874

(22) PCT Filed: Jan. 16, 2007

(86) PCT No.: PCT/JP2007/050527
§ 371 (c)(1),
(2), (4) Date: Jul. 14, 2008

(87) PCT Pub. No.: WO2007/083635
PCT Pub. Date: Jul. 26, 2007

(65) Prior Publication Data
US 2010/0272222 A1 Oct. 28, 2010

(30) Foreign Application Priority Data

Jan. 19, 2006 (JP) ................. 2006-011707
Jan. 15, 2007 (JP) ................. 2007-006364

(51) Int. Cl.
*H04B 1/04* (2006.01)
(52) U.S. Cl. ..... 455/112; 455/113; 455/102; 455/127.2; 375/306; 332/127; 332/128
(58) Field of Classification Search .......... 455/110–113, 455/102, 127.2; 332/119, 120, 123, 127, 332/128; 375/302–308
See application file for complete search history.

(56) References Cited

U.S. PATENT DOCUMENTS 4,068,198 A * 1/1978 Otto ............................. 332/100
4,068,199 A * 1/1978 Madoff ........................ 332/127
(Continued)

FOREIGN PATENT DOCUMENTS

JP 05-343990 12/1993
(Continued)

OTHER PUBLICATIONS

International Search Report dated Apr. 24, 2007.

*Primary Examiner* — Edward Urban
*Assistant Examiner* — RuiMeng Hu
(74) *Attorney, Agent, or Firm* — Dickinson Wright PLLC

(57) ABSTRACT

Provided are a PLL modulation circuit, a radio transmission device, and a radio communication device capable of maintaining a modulation accuracy for modulation of a wide band. The PLL modulation circuit (100) includes: a PLL unit (110), first modulation signal input means for inputting a first modulation signal to a divider (112) or a phase comparator (113) of the PLL unit (110); second modulation signal input means for DA converting the digital modulation signal in a DA converter (116) to generate an analog second modulation signal and inputting it to a voltage control oscillator (111) of the PLL unit (110); a second divider for dividing the output signal of the voltage control oscillator (111); and control means for generating a center frequency control signal, a gain control signal, and a second division ration control signal according to the channel selection signal and the control voltage inputted to the voltage control oscillator (111) and supplying them to the divider (112), the DA converter (116), and the second divider (114), respectively.

5 Claims, 18 Drawing Sheets

U.S. PATENT DOCUMENTS

| | | | |
|---|---|---|---|
| 4,308,508 A | 12/1981 | Sommer | |
| 5,329,258 A * | 7/1994 | Matsuura | 332/100 |
| 5,467,373 A * | 11/1995 | Ketterling | 375/327 |
| 6,211,647 B1 | 4/2001 | Wendelrup | |
| 6,211,747 B1 | 4/2001 | Trichet | |
| 6,515,553 B1 * | 2/2003 | Filiol et al. | 332/127 |
| 6,933,798 B2 * | 8/2005 | Hammes et al. | 332/127 |
| 7,333,582 B2 * | 2/2008 | Yoshikawa et al. | 375/376 |
| 7,363,013 B2 * | 4/2008 | Kuo et al. | 455/112 |
| 7,486,743 B2 * | 2/2009 | Haiut | 375/296 |
| 2004/0192231 A1 * | 9/2004 | Grewing et al. | 455/102 |
| 2005/0242889 A1 | 11/2005 | Mitani | |
| 2007/0109067 A1 * | 5/2007 | O'Sullivan et al. | 332/127 |
| 2007/0149148 A1 * | 6/2007 | Yoshikawa et al. | 455/110 |
| 2007/0200645 A1 * | 8/2007 | Adachi et al. | 332/127 |

FOREIGN PATENT DOCUMENTS

JP    2005-304004    10/2005

* cited by examiner

| CHANNEL SELECTION SIGNAL | CENTER FREQUENCY CONTROL SIGNAL | DIVISION RATIO CONTROL SIGNAL | GAIN CONTROL SIGNAL |
|---|---|---|---|
| ⋮ | ⋮ | ⋮ | ⋮ |
| ⋮ | ⋮ | ⋮ | ⋮ |
| | | | |
| | | | |

| CONTROL VOLTAGE ~S121 | CHANNEL SELECTION SIGNAL ~S106 | CENTER FREQUENCY CONTROL SIGNAL ~S107 | DIVISION RATIO CONTROL SIGNAL ~S108 | GAIN CONTROL SIGNAL ~S109 |
|---|---|---|---|---|
| ⋮ | ⋮ | ⋮ | ⋮ | ⋮ |
| ⋮ | ⋮ | ⋮ | ⋮ | ⋮ |
| | | | | |
| | | | | |

FIG.13

PLL MODULATION CIRCUIT, RADIO TRANSMISSION DEVICE, AND RADIO COMMUNICATION DEVICE

TECHNICAL FIELD

The present invention relates to a PLL modulation circuit that generates a modulation signal, and a radio transmitting apparatus and radio communication apparatus that have this PLL modulation circuit.

BACKGROUND ART

Features generally required of a PLL (Phase Locked Loop) modulation circuit are low cost, low power consumption, low-noise characteristics, and high modulation accuracy. In order to increase the modulation accuracy of a PLL modulation circuit, it is desirable for the PLL bandwidth to be made a wider band than a modulation signal.

However, when the bandwidth of a PLL modulation circuit is made a wide band, its noise characteristics degrade. There has thus been proposed, as a technology for implementing a wideband PLL modulation circuit, two-point modulation whereby the bandwidth of a PLL modulation circuit is set narrower than the bandwidth of a modulation signal, and modulation within the PLL bandwidth and modulation outside the PLL bandwidth are performed at two different places (see Patent Document 1, for example).

FIG. 1 is a drawing showing a simplified configuration of a conventional wideband PLL modulation circuit. As shown in FIG. 1, conventional PLL modulation circuit 10 is equipped with voltage controlled oscillator (VCO) 11, divider 12, phase comparator 13, and loop filter 14.

Voltage controlled oscillator 11 generates RF modulation signal S12 whose oscillation frequency changes according to control voltage signal S11 applied to a control voltage terminal. Divider 12 divides the frequency of RF modulation signal S12 output from voltage controlled oscillator 11. Phase comparator 13 compares the phase of output signal S13 from divider 12 with the phase of reference signal S14, and outputs output signal S15 in accordance with the phase difference. Loop filter 14 smoothes output signal S15 from phase comparator 13.

Conventional PLL modulation circuit 10 also includes DA converter 15, low-pass filter 16, and adder 17.

Digital baseband modulation signal S16 from outside is supplied to divider 12 and DA converter 15. DA converter 15 performs DA conversion of digital baseband modulation signal S16 and supplies the resulting signal to low-pass filter 16. Low-pass filter 16 eliminates noise from output signal S17 from DA converter 15, and supplies the resulting signal to adder 17. Adder 17 adds together the value of output signal S19 from loop filter 14 and the value of output signal S18 from low-pass filter 16 and generates control voltage signal (modulation signal) S11, and supplies this signal to voltage controlled oscillator 11.

As adder 17 generates control voltage signal (modulation signal) S11 by combining two modulation components generated in this way, and supplies this signal to voltage controlled oscillator 11, wideband modulation is implemented.

FIG. 2 is a drawing for explaining the frequency characteristics of a wideband PLL modulation circuit. Here, the PLL transfer function is designated H(s) (where s=jΩ). H(s) has the kind of low-pass characteristic shown in FIG. 2. A low-pass filter with transfer function H(s) is applied to a modulation signal applied to the division ratio set in divider 12. On the other hand, a high-pass filter with the kind of transfer function {1−H(s)} shown in FIG. 2 is applied to a modulation signal applied to the control voltage terminal of voltage controlled oscillator 11.

As these two modulation components are added by adder 17 at the control voltage terminal of voltage controlled oscillator 11, the modulation signal is supplied to voltage controlled oscillator 11 with the flat characteristic shown by the dotted line in FIG. 2 equivalently applied. As a result, it is possible to output a wideband RF modulation signal that extends beyond the PLL band.

Factors that affect the modulation accuracy of two-point modulation will now be described.

Factors that lower modulation accuracy are voltage controlled oscillator 11 control sensitivity (hereinafter referred to as "control sensitivity") mismatching and control sensitivity nonlinearity.

First, control sensitivity mismatching will be explained.

Degradation of modulation accuracy due to control sensitivity mismatching occurs when the amplitude of a signal output from DA converter 15 and the control sensitivity of voltage controlled oscillator 11 do not match. Control sensitivity denotes conversion gain when the amplitude of a modulation signal input to the control voltage terminal of voltage controlled oscillator 11 is converted to a frequency shift of RF modulation signal S12 output from voltage controlled oscillator 11. The unit of control sensitivity is [Hz/V].

If the control sensitivity does not match, transfer function {1−H(s)} fluctuates as shown in FIG. 3. FIG. 3 shows a transfer function when transfer function {1−H(s)} is multiplied by an a-fold deviation amount. That is to say, the combined characteristic of H(s) and {1−H(s)} is no longer flat gain, as shown by the dotted line in FIG. 3. This is a factor in the degradation of modulation accuracy.

As a way of countering this problem, a method has been devised whereby a control sensitivity table is prepared for per-LSI control sensitivity due to element value variation, and matching of modulation signal amplitude and control sensitivity is achieved according to the oscillation frequency (see Patent Document 2, for example). By means of this method, degradation of modulation accuracy when control sensitivity fluctuates can be suppressed.

Next, control sensitivity nonlinearity will be explained.

Thus far, control sensitivity has been described as a straight line whose slope differs according to the oscillation frequency. In a system that handles a narrowband modulation signal, there is no problem if this control sensitivity is treated approximately as a straight line.

Patent Document 1: U.S. Pat. No. 4,308,508 specification
Patent Document 2: U.S. Pat. No. 6,211,647 specification

DISCLOSURE OF INVENTION

Problems to be Solved by the Invention

However, a problem with a conventional PLL modulation circuit is that it is difficult to maintain modulation accuracy for wideband modulation.

This problem will now be explained in detail.

In a PLL modulation circuit that handles a wideband modulation signal, voltage controlled oscillator 11 control sensitivity is not linear, but nonlinear with a distortion characteristic.

In FIG. 4, a control voltage-frequency characteristic line of a voltage controlled oscillator having this characteristic is shown in graphic form. The nonlinearity/linearity boundaries shown here will differ according to system requirements (modulation bandwidth, frequency band, and so forth).

When modulation is performed using a nonlinear part of the control voltage-frequency characteristic line in voltage controlled oscillator 11 having this kind of characteristic, modulation accuracy degrades.

Due to such device characteristics, a method is generally used that provides a countermeasure by switching the voltage controlled oscillator 11 band so that a nonlinear region of the control voltage-frequency characteristic line in voltage controlled oscillator 11 is not normally used for modulation. However, if the modulation band is wide, many bands must be integrated in one voltage controlled oscillator 11, which is difficult from a design standpoint.

Another possible method is to make the control sensitivity of voltage controlled oscillator 11 high, and use only one band, but problems include the fact that a high control sensitivity is sensitive to minute voltage fluctuations, and characteristic fluctuations due to production variations cannot be handled, making it difficult to maintain performance.

Another problem with a conventional PLL modulation circuit is that it is difficult to maintain modulation accuracy for wideband modulation since there is no countermeasure to nonlinearity of the control voltage-frequency characteristic curve in voltage controlled oscillator 11.

The present invention has been implemented taking into account the problems described above, and it is an object of the present invention to provide a PLL modulation circuit, radio transmitting apparatus, and radio communication apparatus that enable modulation accuracy to be maintained for wideband modulation.

Means for Solving the Problems

A PLL modulation circuit according to a first configuration of the present invention employs a configuration having: a PLL section that includes a voltage controlled oscillator, a first divider that divides an output signal of the voltage controlled oscillator, a phase comparator that compares the phase of an output signal of the first divider with the phase of a reference signal, and a loop filter that smoothes an output signal of the phase comparator; a first modulation signal input section that inputs a first modulation signal to the divider or the phase comparator as a first input location of the PLL section; a second modulation signal input section that performs DA conversion of a digital modulation signal with a DA converter and generates an analog second modulation signal, and inputs that analog second modulation signal to the voltage controlled oscillator as a second input location of the PLL section; a second divider that divides an output signal of the voltage controlled oscillator; and a control section that generates a center frequency control signal, a gain control signal, and a division ratio control signal for the second divider based on an input channel selection signal and control voltage, supplies the center frequency control signal to the first divider, supplies the gain control signal to the DA converter, and supplies the division ratio control signal to the second divider.

According to this configuration, the influence of nonlinearity of a control voltage-frequency characteristic line in the voltage controlled oscillator can be avoided, enabling modulation accuracy to be maintained for wideband modulation.

A PLL modulation circuit according to a second configuration of the present invention employs a configuration having: a PLL section that includes a voltage controlled oscillator, a first divider that divides an output signal of the voltage controlled oscillator, a phase comparator that compares the phase of an output signal of the first divider with the phase of a reference signal, and a loop filter that smoothes an output signal of the phase comparator; a first modulation signal input section that inputs a first modulation signal to the divider or the phase comparator as a first input location of the PLL section; a second modulation signal input section that performs DA conversion of a digital modulation signal with a DA converter and generates an analog second modulation signal, and inputs that analog second modulation signal to the voltage controlled oscillator as a second input location of the PLL section; a second divider that divides an output signal of the voltage controlled oscillator; and a control section that has a table storing beforehand an input channel selection signal and control voltage, and a center frequency control signal, a gain control signal, and a division ratio control signal for the second divider corresponding to that channel selection signal and that control voltage, searches the table based on the channel selection signal and the control voltage input to the voltage controlled oscillator and generates the center frequency control signal, the gain control signal, and the division ratio control signal, supplies the center frequency control signal to the first divider, supplies the gain control signal to the DA converter, and supplies the division ratio control signal to the second divider.

According to this configuration, the influence of nonlinearity of a control voltage-frequency characteristic line in the voltage controlled oscillator can be avoided, enabling modulation accuracy to be maintained for wideband modulation.

Also, according to this configuration, since a table is provided that stores beforehand a channel selection signal and control voltage input to the voltage controlled oscillator, and a center frequency control signal, gain control signal, and division ratio control signal for the second divider corresponding to that channel selection signal and that control voltage, it is possible to implement a control operation quickly.

A PLL modulation circuit according to a third configuration of the present invention employs a configuration having: a PLL section that includes a voltage controlled oscillator, a first divider that divides an output signal of the voltage controlled oscillator, a phase comparator that compares the phase of an output signal of the first divider with the phase of a reference signal, and a loop filter that smoothes an output signal of the phase comparator; a first modulation signal input section that inputs a first modulation signal to the divider or the phase comparator as a first input location of the PLL section; a control voltage detection section that detects an input control voltage and generates a control voltage detection value; a voltage comparison section that compares the control voltage detection value with a predetermined first reference voltage value and second reference voltage value and generates a voltage comparison result; a second modulation signal input section that performs DA conversion of a digital modulation signal with a DA converter and generates an analog second modulation signal, and inputs that analog second modulation signal to the voltage controlled oscillator as a second input location of the PLL section; a second divider that divides an output signal of the voltage controlled oscillator; and a control section that has a table storing beforehand an input channel selection signal and control voltage, and a center frequency control signal, a gain control signal, and a division ratio control signal for the second divider corresponding to that channel selection signal and that control voltage, searches the table based on the channel selection signal and the control voltage input to the voltage controlled oscillator and the voltage comparison result and generates the center frequency control signal, the gain control signal, and the division ratio control signal, supplies the center frequency control signal to the first divider, supplies the gain control signal to the DA converter, and supplies the division ratio control signal to the second divider.

According to this configuration, the influence of nonlinearity of a control voltage-frequency characteristic line in the voltage controlled oscillator can be avoided, enabling modulation accuracy to be maintained for wideband modulation.

Also, according to this configuration, since a table is provided that stores beforehand a channel selection signal and control voltage input to the voltage controlled oscillator, and a center frequency control signal, gain control signal, and division ratio control signal for the second divider corresponding to that channel selection signal and that control voltage, it is possible to implement a control operation quickly.

Moreover, according to this configuration, since a control voltage detection section that detects a control voltage input to the voltage controlled oscillator and generates a control voltage detection value, and a voltage comparison section that compares the control voltage detection value with a predetermined first reference voltage value and second reference voltage value and generates a voltage comparison result, are provided, whether the control voltage-frequency characteristic in the voltage controlled oscillator output signal has linearity can be monitored constantly, making more dynamic compensation operation possible.

A radio transmitting apparatus according to a fourth configuration of the present invention employs a configuration having a PLL modulation circuit according to the above-described first configuration of the present invention, and an amplifier that amplifies an RF modulation signal output from the PLL modulation circuit.

According to this configuration, providing a PLL modulation circuit of the present invention makes it possible to implement a radio transmitting apparatus that maintains modulation accuracy for wideband modulation, and enables a high-quality transmit signal of high modulation accuracy to be transmitted from a base station or the like, for example.

A radio communication apparatus according to a fifth configuration of the present invention employs a configuration having: a transmitting section that has a PLL modulation circuit according to the above-described first configuration of the present invention; a receiving section that demodulates a received signal; an antenna; and a transmit/receive switching section that switches between supply of a transmit signal from the transmitting section to the antenna and supply of a received signal from the antenna to the receiving section.

According to this configuration, it is possible to implement a radio communication apparatus that maintains modulation accuracy for wideband modulation, and high-quality transmit signals and received signals of high modulation accuracy can be transmitted and received. Therefore, if this configuration is applied to a mobile phone, for example, high-quality call transmission and reception is possible, and user convenience is improved.

Advantageous Effect of the Invention

According to the present invention, use of an above-described configuration enables modulation accuracy to be maintained for wideband modulation.

BRIEF DESCRIPTION OF DRAWINGS

FIG. 7 is a drawing for explaining a table of the control unit in FIG. 6;

FIG. 13 is a drawing for explaining a table of the control unit in FIG. 12;

BEST MODE FOR CARRYING OUT THE INVENTION

Embodiments of the present invention will now be described in detail with reference to the accompanying drawings.

Embodiment 1

Figure 5:
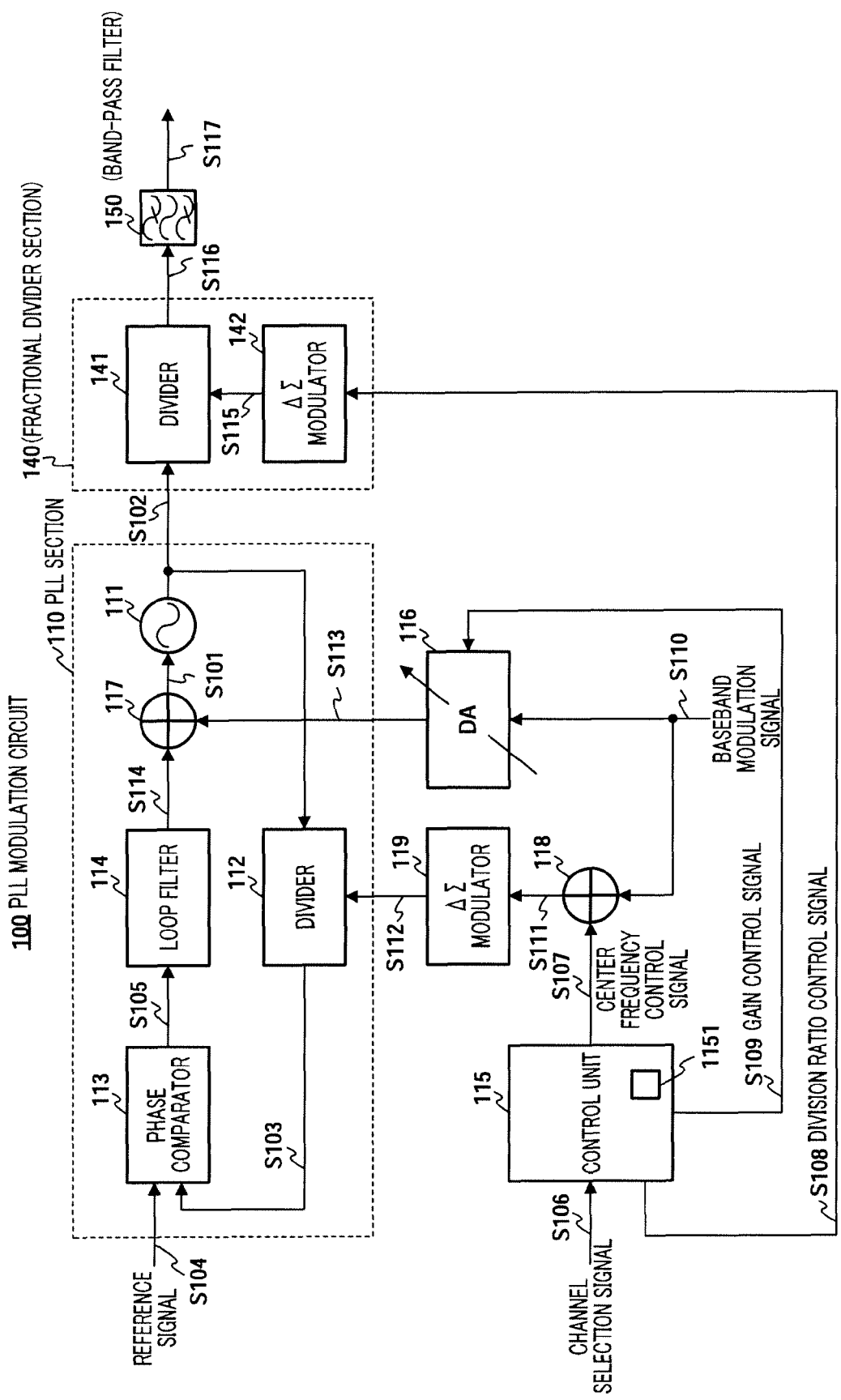
FIG. 5 is a block diagram showing the configuration of a PLL modulation circuit according to Embodiment 1 of the present invention.

FIG. 5 is a block diagram showing the configuration of a PLL modulation circuit according to Embodiment 1 of the present invention.

As shown in FIG. 5, PLL modulation circuit 100 has PLL section 110, fractional divider section 140, and band-pass filter 150.

PLL section 110 has voltage controlled oscillator 111, divider 112, phase comparator 113, and loop filter 114.

Voltage controlled oscillator 111 generates RF modulation signal S102 whose oscillation frequency changes according to control voltage signal S101 applied to the control voltage terminal. Divider 112 divides the frequency of RF modulation signal S102 output from voltage controlled oscillator 111. Phase comparator 113 compares the phase of divider 112 output signal S103 with the phase of reference signal S104, and outputs output signal S105 in accordance with the phase difference. Loop filter 114 smoothes phase comparator 113 output signal S105.

PLL modulation circuit 100 also has control unit 115, DA converter (DAC) 116, adder 117, adder 118, and delta-sigma modulator 119.

Figure 6:
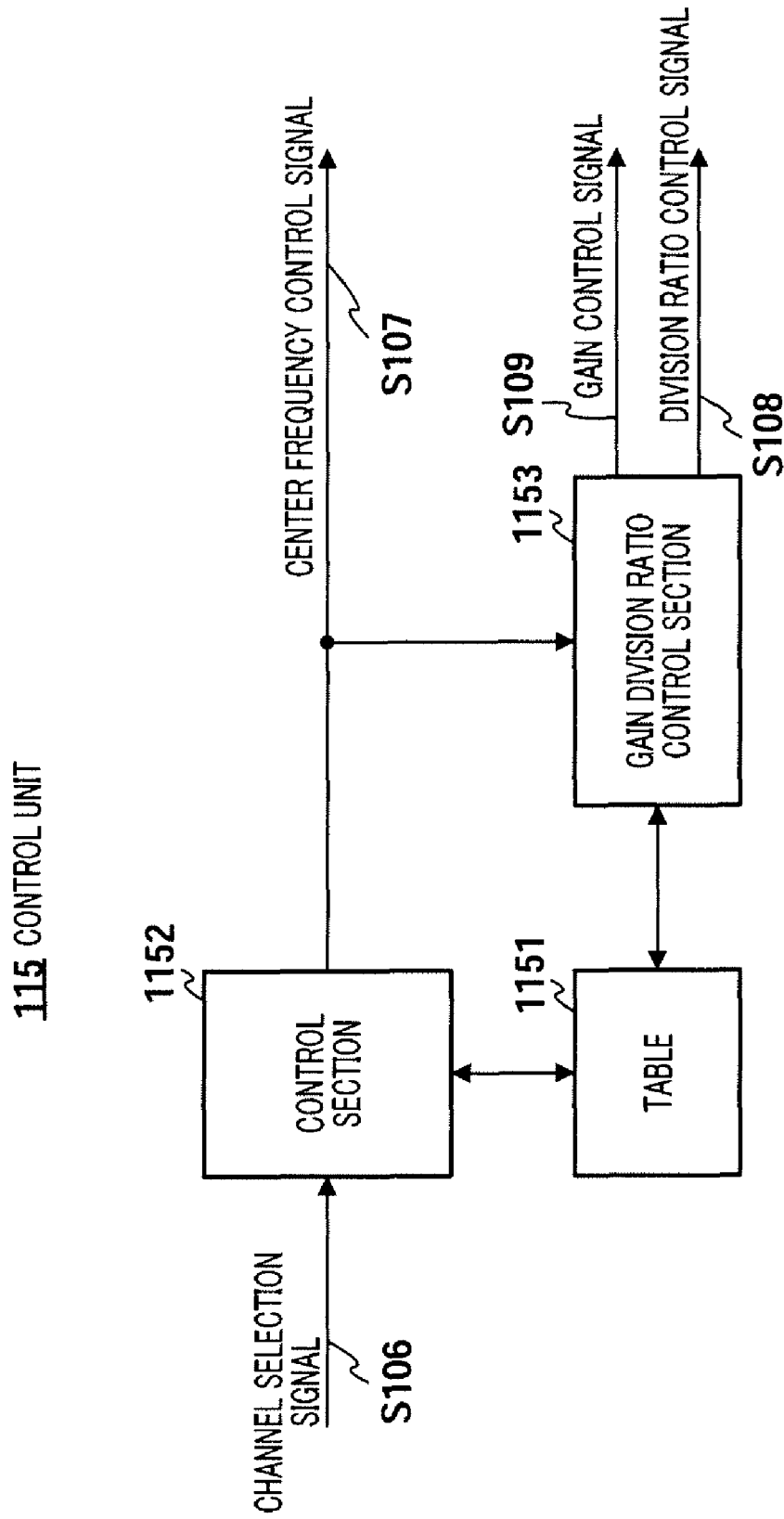
FIG. 6 is a block diagram showing the configuration of the control unit of a PLL modulation circuit according to Embodiment 1.

As shown in FIG. 6, control unit 115 has lookup table or suchlike table 1151, control section 1152, and gain division ratio control section 1153.

As shown in FIG. 7, table 1151 stores beforehand center frequency control signal S107, division ratio control signal S108, and gain control signal S109, corresponding to channel selection signal S106. When channel selection signal S106 is received, control section 1152 searches table 1151 based on this channel selection signal S106, and generates center frequency control signal S107 corresponding to that channel selection signal S106. Here, center frequency control signal S107 is assumed to be the same as a PLL lock frequency signal.

Control section 1152 supplies center frequency control signal S107 to gain division ratio control section 1153 and adder 118. Gain division ratio control section 1153 searches table 1151 based on center frequency control signal S107 from control section 1152, and generates gain division ratio control signal S108 and control signal S109 corresponding to that center frequency control signal S107. Gain division ratio control section 1153 supplies division ratio control signal S108 to fractional divider section 140, and supplies gain control signal S109 to DA converter 116.

As shown in FIG. 5, digital baseband modulation signal S110 from outside is supplied to DA converter 116 and adder 118. Adder 118 adds together the value of center frequency control signal S107 and the value of baseband modulation signal S110, and supplies post-addition modulation signal S111 to delta-sigma modulator 119. Delta-sigma modulator 119 performs delta-sigma modulation of modulation signal S111 from adder 118 and generates division ratio control signal S112, and supplies this signal to divider 112. Divider 112 divides the frequency of RF modulation signal S102 output from voltage controlled oscillator 111 by the division ratio of division ratio control signal S112, and outputs output signal S103.

DA converter 116 performs digital/analog (DA) conversion of digital baseband modulation signal S110 from outside with the gain of gain control signal S109 and generates analog modulation signal S113, and supplies this signal to adder 117.

Adder 117 adds together the value of output signal S114 from loop filter 114 and the value of modulation signal S113 from DA converter 116 and generates control voltage signal S101, and supplies this signal to voltage controlled oscillator 111.

Voltage controlled oscillator 111 generates modulation signal (RF modulation signal) S102 whose frequency changes according to control voltage signal S101 from adder 117, and supplies this signal to fractional divider section 140.

Fractional divider section 140 has divider 141 and delta-sigma modulator 142.

Delta-sigma modulator 142 performs delta-sigma modulation of division ratio control signal S108 from control unit 115 and generates modulation division ratio control signal S115, and supplies this signal to divider 141. Divider 141 divides RF modulation signal S102 from voltage controlled oscillator 111 by the division ratio of modulation division ratio control signal S115 from delta-sigma modulator 142 and generates divided modulation signal S116, and supplies this signal to band-pass filter 150.

Band-pass filter 150 eliminates a high-frequency wave and spurious signal contained in divided modulation signal S116 of divider 141, and sends out output signal (RF modulation signal) S117.

Next, normal modulation operation of PLL modulation circuit 100 according to Embodiment 1 of the present invention will be described.

As described above, baseband modulation signal S110 and center frequency control signal S107 generated based on channel selection signal S106 input from control unit 115 are input to delta-sigma modulator 119, and input as division ratio control signal S112 to PLL section 110, where modulation is applied. Also, modulation signal S113 resulting from conversion of baseband modulation signal S110 to an analog signal by DA converter 116, and output signal S114 from loop filter 114, are added together by adder 117. By this means, PLL modulation circuit 100 operates as a wideband two-point modulation PLL.

Next, distortion compensation operation of PLL modulation circuit 100 according to Embodiment 1 of the present invention will be described.

Figure 1:
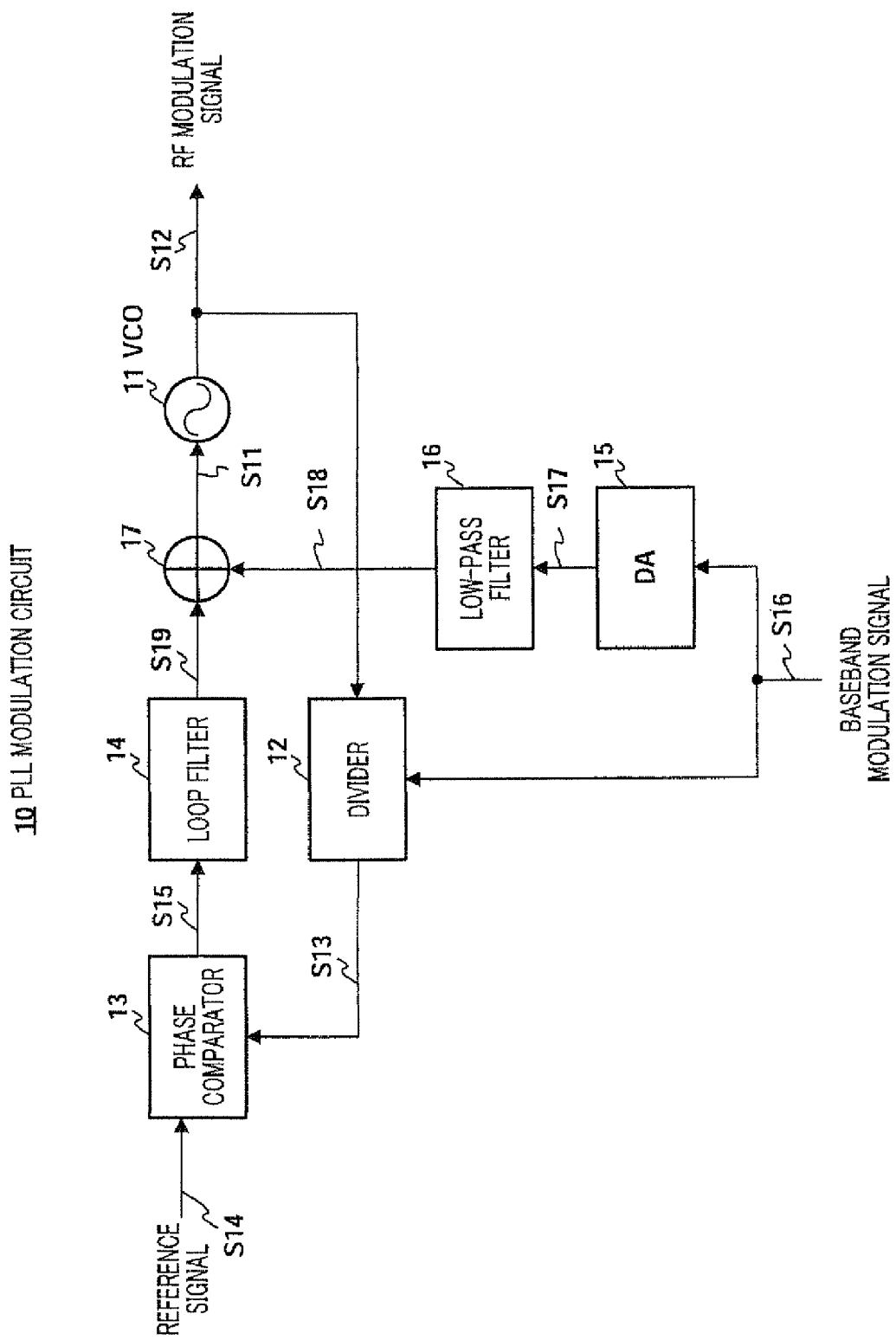
FIG. 1 is a block diagram showing the configuration of a conventional PLL modulation circuit.
Figure 2:
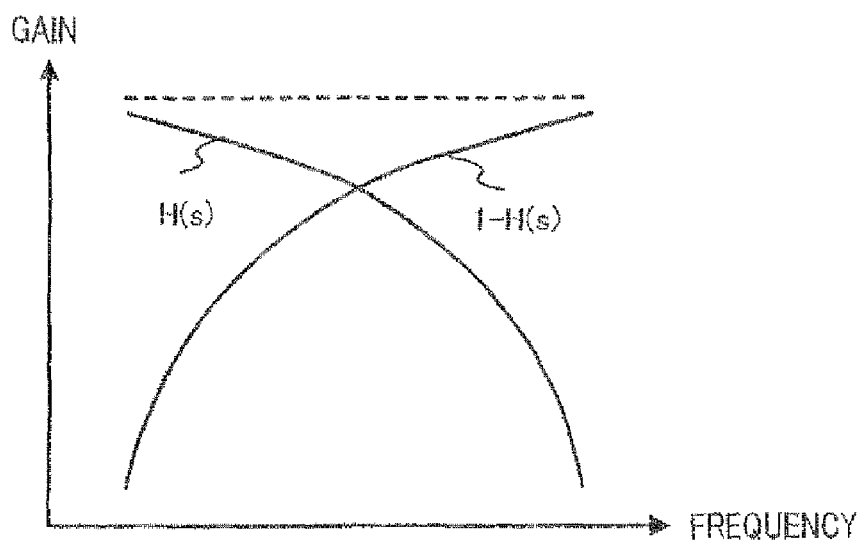
FIG. 2 is a drawing for explaining one example of the operation of a conventional PLL modulation circuit.
Figure 3:
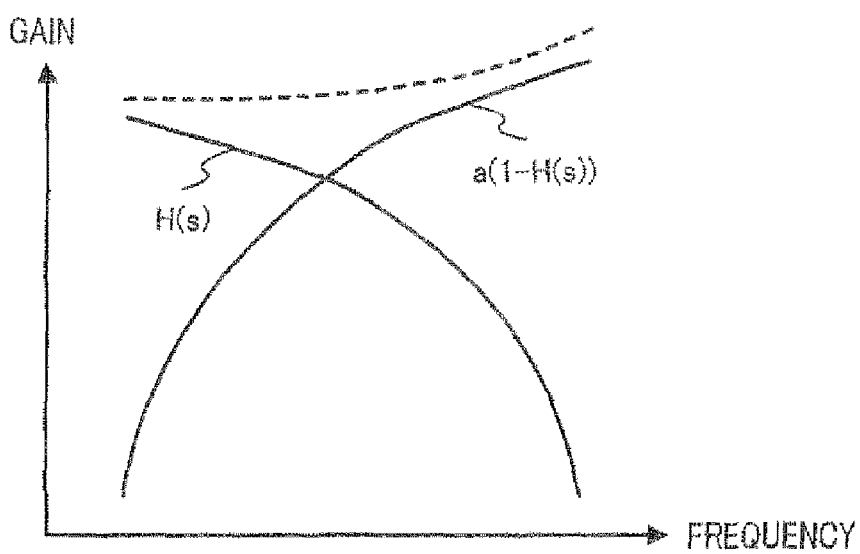
FIG. 3 is a drawing for explaining another example of the operation of a conventional PLL modulation circuit.
Figure 4:
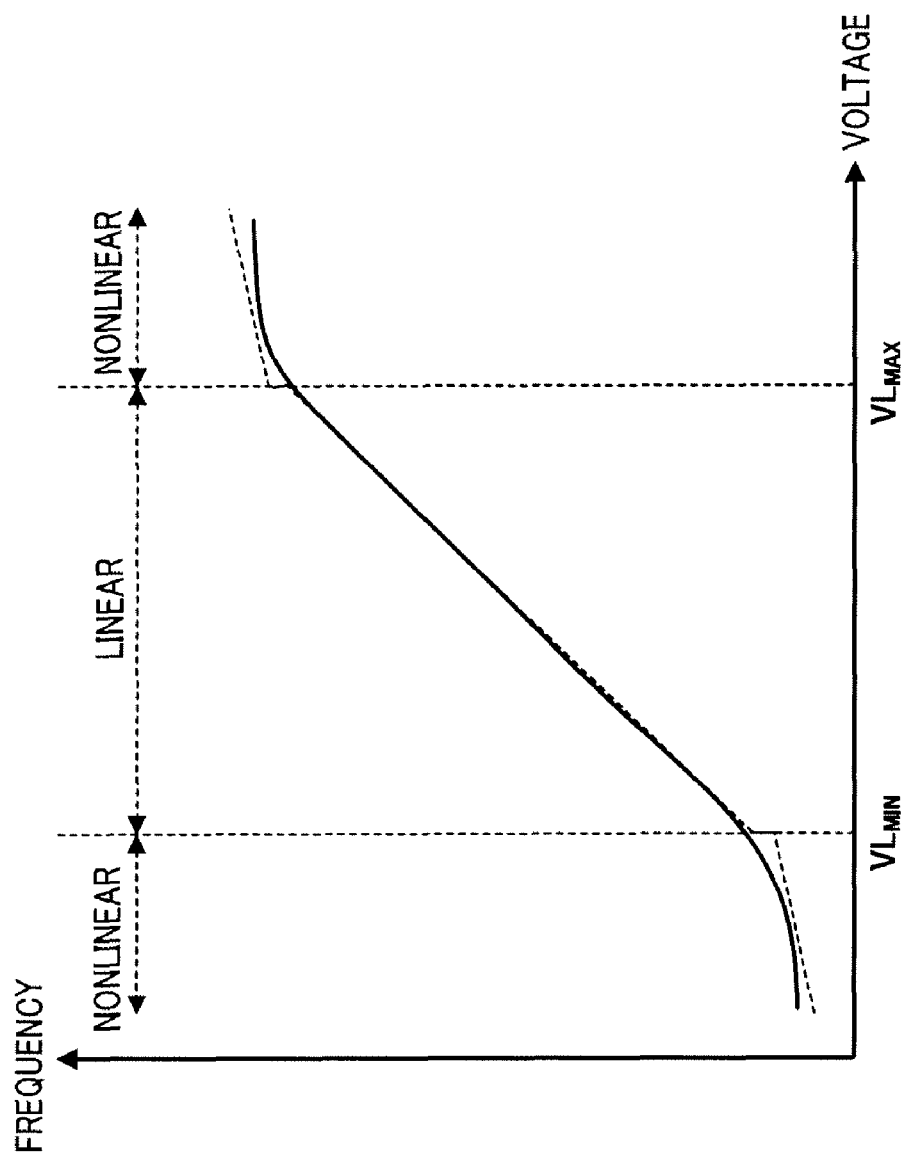
FIG. 4 is a characteristic curve drawing for explaining the operation of a PLL modulation circuit that handles a wideband modulation signal.

In order to compensate for degradation of modulation accuracy due to above-described voltage controlled oscillator 111 distortion characteristics, during system design or construction, a control voltage range is established for which linearity of the voltage controlled oscillator 111 oscillation frequency-control voltage characteristic line can be guaranteed when modulation is applied in that system. The maximum control voltage for which this linearity can be guaranteed is designated $VL_{MAX}$, and the minimum control voltage for which the linearity can be guaranteed is designated $VL_{MIN}$, as illustrated in FIG. 4.

When the voltage of an input signal is Vt, if Vt is a voltage that satisfies the condition $VL_{MIN} \leq Vt \leq VL_{MAX}$, the voltage controlled oscillator 111 output signal will not suffer distortion, and severe degradation of modulation accuracy will not occur.

Although limiting the Vt voltage prevents the occurrence of distortion of the voltage controlled oscillator 111 output signal, the necessary oscillation frequency cannot be obtained by this means.

Thus, the oscillation frequency is different from the desired frequency, but the frequency required by the system can be obtained by outputting a signal in a region for which the control sensitivity-oscillation frequency characteristic line is linear, and dividing that signal by an appropriate division ratio. This will be explained with reference to an actual example using FIG. 8.

Figure 8A:
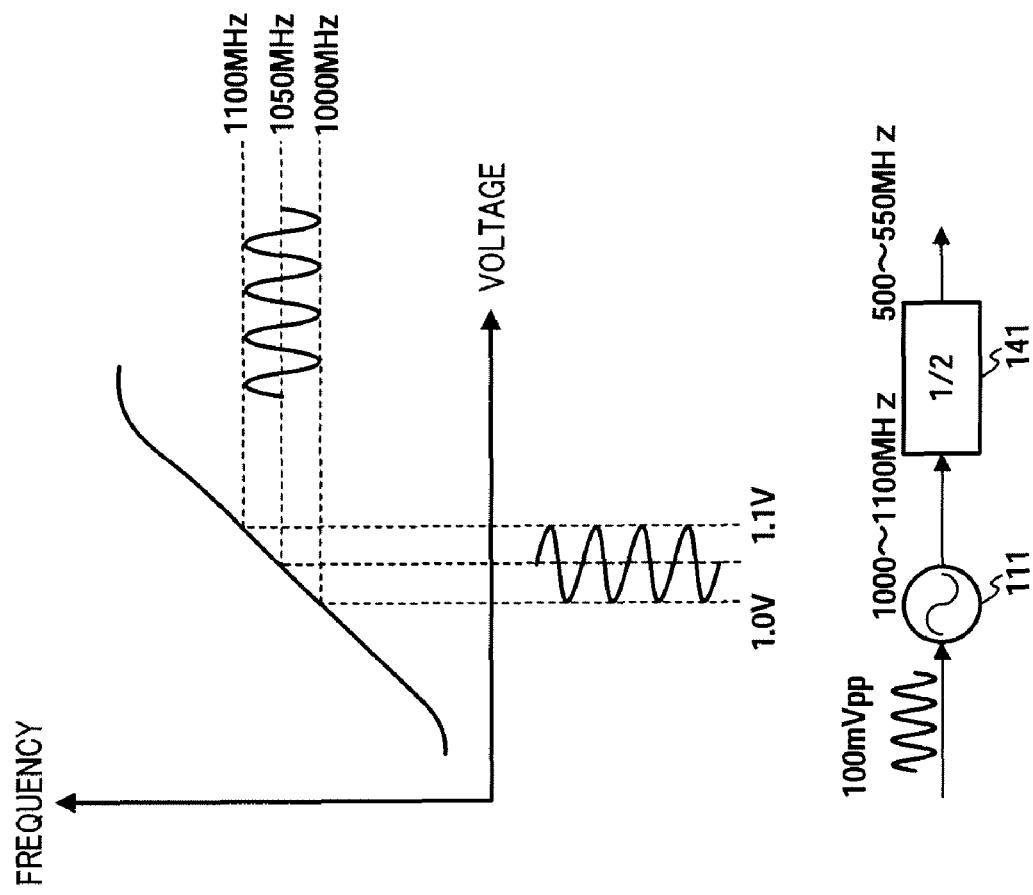
FIG. 8A is a drawing for explaining one example of the operation of a general PLL modulation circuit.
Figure 8B:
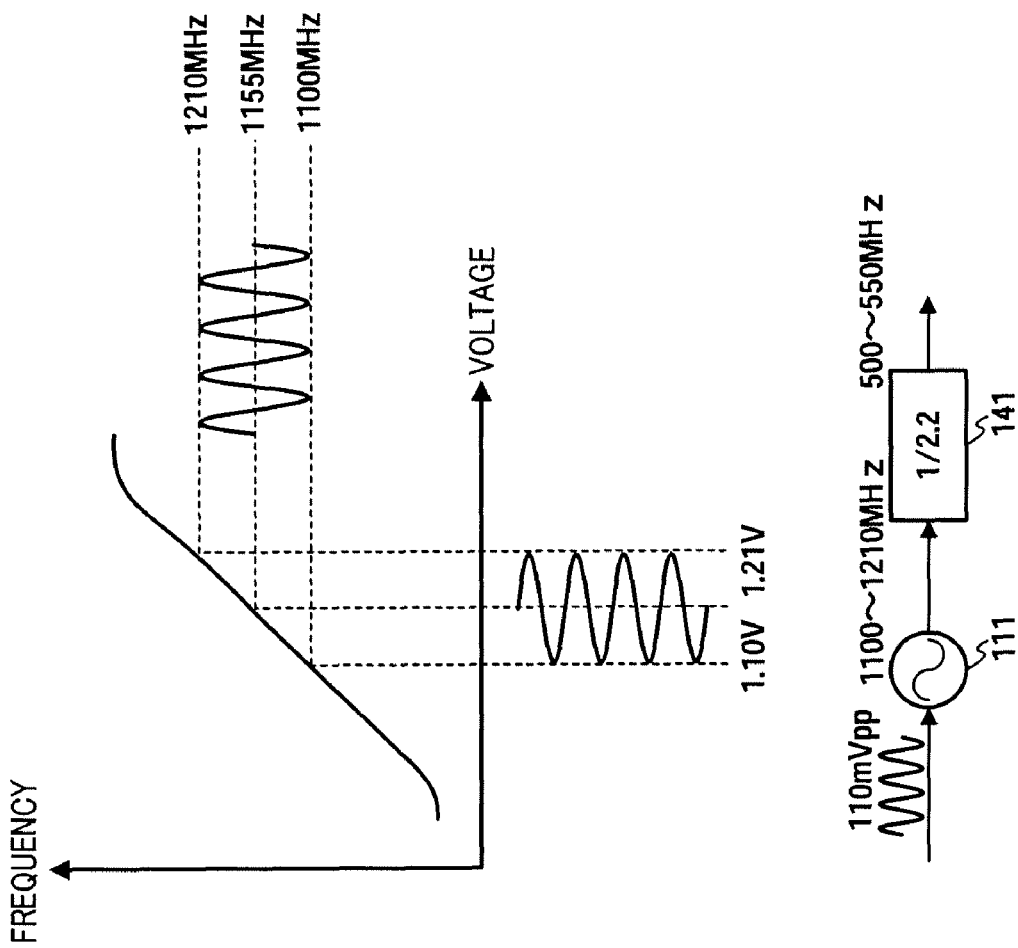
FIG. 8B is a drawing for explaining the operation of a PLL modulation circuit according to Embodiment 1.
Figure 8C:
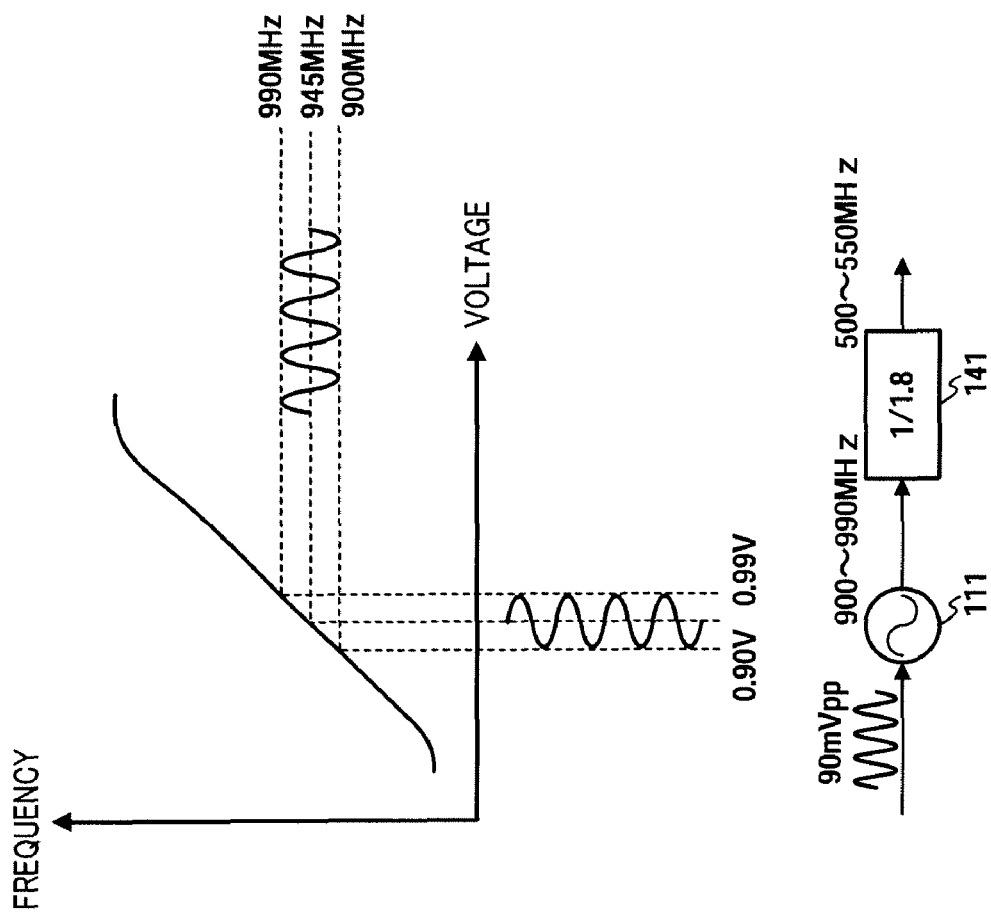
FIG. 8C is a drawing for explaining the operation of a PLL modulation circuit according to Embodiment 1.

FIG. 8A through FIG. 8C show the relationship between the control voltage of control voltage signal S101 input to voltage controlled oscillator 111 and its output frequency, and the division ratio of divider 141 and the frequency of the output signal, which is the divided modulation signal S116.

In these examples, the object is assumed to be ultimately to obtain a voltage controlled oscillator 111 output signal with a frequency of 500 to 550 MHz.

In FIG. 8A, voltage controlled oscillator 111 with a control sensitivity of 100 MHz/V is used, and a signal with a voltage of 100 mVpp centered on 1.05 V is used as an input signal. As a result, the voltage controlled oscillator 111 output signal has a frequency of 1000 MHz to 1100 MHz. Input/output is divided by 2 by subsequent-stage divider 141, and an output frequency of 500 MHz to 550 MHz is obtained.

Here, there is no problem if a 1000 MHz to 1100 MHz oscillation frequency can maintain linearity in the control voltage-frequency characteristic line in voltage controlled oscillator 111. However, when the oscillation frequency is in a nonlinear region in the control voltage-frequency characteristic of the voltage controlled oscillator 111 output signal, the voltage controlled oscillator 111 output signal is distorted, leading to degradation of modulation accuracy.

If minimum control voltage $VL_{MIN}$ for which linearity can be maintained in the control voltage-frequency characteristic of the output signal of this voltage controlled oscillator 111 is here assumed to be 1.05 V (the oscillation frequency being 1050 MHz at this time), the output signal will be distorted in this example, and modulation accuracy will degrade.

Thus, high modulation accuracy can be maintained by making the control voltage greater than or equal to $VL_{MIN}$ (shifting the oscillation frequency), and setting the division ratio of divider 141 and the amplitude of the input modulation signal to appropriate numeric values that enable the desired frequency to be obtained.

This example will now be explained with reference to FIG. 8B.

In the example in FIG. 8B, the center frequency is shifted to 1155 MHz, and oscillation is performed in a linear region of the control voltage-frequency characteristic.

The operation and configuration whereby the oscillation frequency is shifted will now be described.

A condition for an oscillation frequency shift is a case in which a modulation signal for which the control voltage is smaller than $VL_{MIN}$, or the control voltage is larger than $VL_{MAX}$, is input to voltage controlled oscillator 111.

A frequency shift condition detection apparatus that detects this has a memory apparatus that stores $VL_{MIN}$ and $VL_{MAX}$ beforehand, an AD converter that is provided in a path that feeds back a control voltage and converts the control voltage to a digital value, and a voltage comparison apparatus that compares the control voltage from this AD converter with $VL_{MIN}$ and $VL_{MAX}$ of the memory apparatus and generates a voltage comparison result.

When the voltage comparison result of this voltage comparison apparatus shows that the control voltage is smaller than $VL_{MIN}$, or that the control voltage is larger than $VL_{MAX}$, an operation is executed that adds or subtracts a predetermined voltage to/from the current control voltage.

This can be implemented by switching the PLL division ratio. Normally, the PLL division ratio is set and manipulated when a channel switching operation or modulation operation is performed. The frequency shift amount can be added to these division ratios. This processing can be executed by an adder.

In order to obtain the desired frequency from this shifted frequency, divider 141 division ratio and amplitude settings are made.

Next, a divider 141 division ratio setting operation will be described.

The divider 141 division ratio value can be obtained by calculating [shifted frequency center frequency/desired frequency].

In the example in FIG. 8B, the divider 141 division ratio value is 1155 MHz/525 MHz=2.2. Here, the center frequency of the shifted frequency can be obtained from the PLL division ratio and reference frequency.

The desired frequency is identified in the system design stage, and depends on internal control such as channel selection as a fluctuation factor.

Therefore, the divider 141 division ratio is found uniquely from the PLL division ratio and channel selection signal, and can easily be implemented by means of a lookup table alone.

Next, the gain control signal will be described.

In order to obtain a desired frequency, it is necessary to adjust the amplitude of a modulation signal input directly by DA converter 116 with respect to the control voltage of voltage controlled oscillator 111.

In the example in FIG. 8B, in order to obtain a desired frequency of 500 MHz to 550 MHz when division by 2.2 is performed, a modulation signal having an amplitude of 100 mVpp centered on a 1.155 V voltage should be supplied to voltage controlled oscillator 111 having a control sensitivity of 100 MHz/V.

Here, the control voltage amplitude is established uniquely if the control sensitivity of voltage controlled oscillator 111, the division ratio of divider 141, and the desired frequency are known. As the sensitivity of voltage controlled oscillator 111 is decided in the design stage, it can be implemented by means of a lookup table in the same way as the divider 141 division ratio, and since it is possible to use a common index, only a small increase in memory capacity is necessary.

For the description of distortion compensation operation of PLL modulation circuit 100 according to Embodiment 1 of the present invention, a case will be described in which the voltage of an input modulation signal is higher than the maximum control voltage range for which linearity can be maintained.

If maximum control voltage $VL_{MAX}$ for which linearity can be maintained in the control voltage-frequency characteristic of the output signal of this voltage controlled oscillator 111 is here assumed to be 1.05 V (the oscillation frequency being 1050 MHz at this time), the output signal will be distorted in this example, and modulation accuracy will degrade.

Thus, high modulation accuracy can be maintained by making the control voltage less than or equal to $VL_{MAX}$ (shifting the oscillation frequency), and setting the division ratio of divider 141 and the amplitude of the input modulation signal to appropriate numeric values that enable the desired frequency to be obtained.

This example will now be explained with reference to FIG. 8C.

In the example in FIG. 8C, the center frequency is shifted to 945 MHz, and oscillation is performed in a linear region of the control voltage-frequency characteristic.

The operation and configuration whereby the oscillation frequency is shifted will now be described.

A condition for an oscillation frequency shift is a case in which a modulation signal for which the control voltage is smaller than $VL_{MIN}$, or the control voltage is larger than $VL_{MAX}$, is input to voltage controlled oscillator 111.

A frequency shift condition detection apparatus that detects this has a memory apparatus that stores $VL_{MIN}$ and $VL_{MAX}$ beforehand, an AD converter that is provided in a path that feeds back a control voltage and converts the control voltage to a digital value, and a voltage comparison apparatus that compares the control voltage from this AD converter with $VL_{MIN}$ and $VL_{MAX}$ of the memory apparatus and generates a voltage comparison result.

When the voltage comparison result of this voltage comparison apparatus shows that the control voltage is smaller than $VL_{MIN}$, or that the control voltage is larger than $VL_{MAX}$, an operation is executed that adds or subtracts a predetermined voltage to/from the current control voltage.

This can be implemented by switching the PLL division ratio. Normally, the PLL division ratio is set and manipulated when a channel switching operation or modulation operation is performed. The frequency shift amount can be added to these division ratios. This processing can be executed by an adder.

In order to obtain the desired frequency from this shifted frequency, divider 141 division ratio and amplitude settings are made.

Next, a divider 141 division ratio setting operation will be described.

The divider 141 division ratio value can be obtained by calculating [shifted frequency center frequency/desired frequency].

In the example in FIG. 8C, the divider 141 division ratio value is 945 MHz/525 MHz=1.8. Here, the center frequency of the shifted frequency can be obtained from the PLL division ratio and reference frequency.

The desired frequency is identified in the system design stage, and depends on internal control such as channel selection as a fluctuation factor.

Therefore, the divider 141 division ratio is found uniquely from the PLL division ratio and channel selection signal, and can easily be implemented by means of a lookup table alone.

Next, the gain control signal will be described.

In order to obtain a desired frequency, it is necessary to control the gain of DA converter 116 and adjust the amplitude of a modulation signal input directly with respect to the control voltage of voltage controlled oscillator 111.

In the example in FIG. 8C, in order to obtain a desired frequency of 500 MHz to 550 MHz when division by 1.8 is performed, a modulation signal having an amplitude of 90 mVpp centered on a 0.945 V voltage should be supplied to voltage controlled oscillator 111 having a control sensitivity of 100 MHz/V.

The present invention also deals with the problem of a case in which the control sensitivity is raised. Therefore, provision is made for the division ratio of divider 141 to be set with a fine degree of resolution. Consequently, divider 141 is configured as a fractional divider implemented by means of delta-sigma modulator 142.

Figure 9:
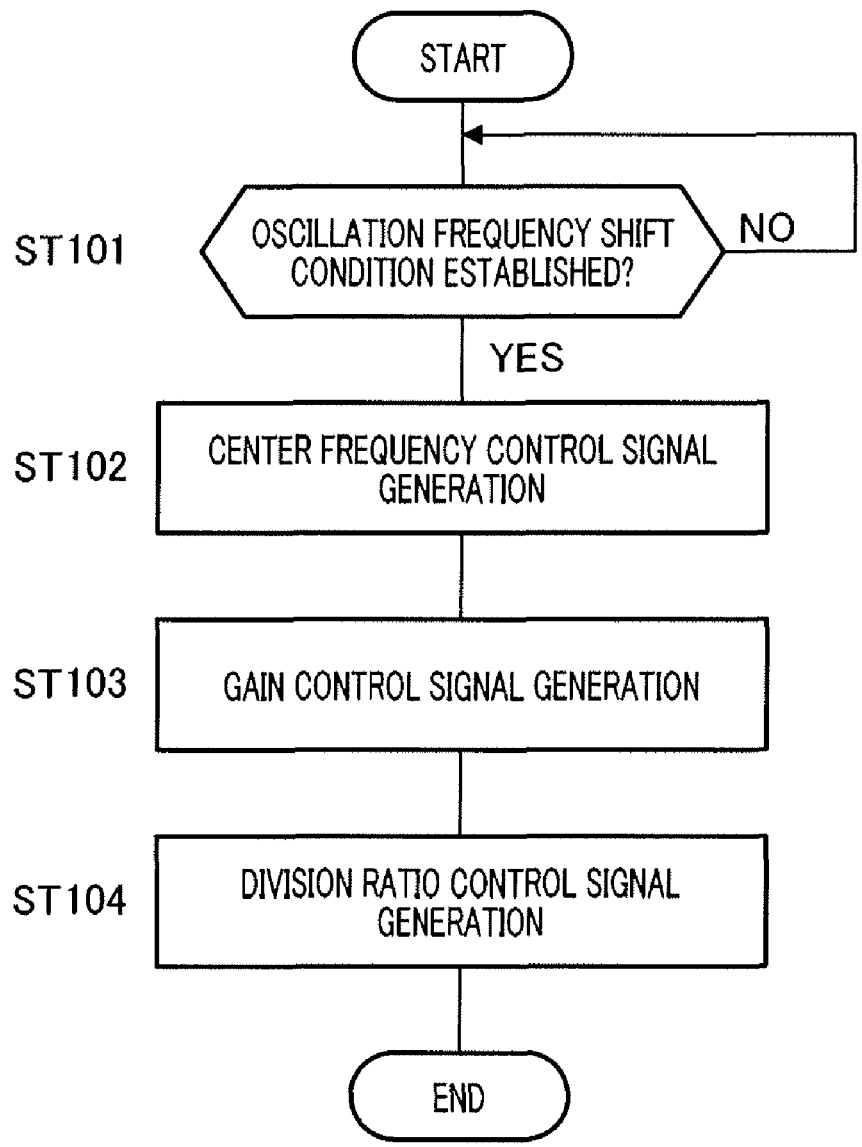
FIG. 9 is a flowchart for explaining the operation of a PLL modulation circuit according to Embodiment 1.

Next, the operation of control unit 115 of PLL modulation circuit 100 according to Embodiment 1 of the present invention will be described with reference to FIG. 9. FIG. 9 is a flowchart for explaining the operation of control unit 115 of PLL modulation circuit 100 according to Embodiment 1 of the present invention.

In step ST101, the above-mentioned frequency shift condition detection apparatus is used to determine whether or not an oscillation frequency shift condition is established, and a voltage comparison result is generated. If this voltage comparison result shows that the control voltage is smaller than $VL_{MIN}$, or that the control voltage is larger than $VL_{MAX}$, an oscillation frequency shift condition is deemed to have been established.

If an oscillation frequency shift condition is established in step ST101, control unit 115 generates center frequency control signal S107, gain control signal S109, and division ratio control signal S108 (step ST102, step ST103, step ST104) based on channel selection signal S106 and control voltage S101, and supplies these generated signals to delta-sigma modulator 119, DA converter 116, and fractional divider section 140, respectively.

According to Embodiment 1 of the present invention, the influence of nonlinearity of a control voltage-frequency characteristic line in a voltage controlled oscillator can be avoided, enabling modulation accuracy to be maintained for wideband modulation.

Also, since Embodiment 1 of the present invention has a table that stores beforehand a channel selection signal and control voltage input to the voltage controlled oscillator, and a center frequency control signal, gain control signal, and division ratio control signal corresponding to that channel selection signal and that control voltage, a control operation is speedy.

Embodiment 2

Next, Embodiment 2 of the present invention will be described in detail with reference to the accompanying drawings.

Figure 10:
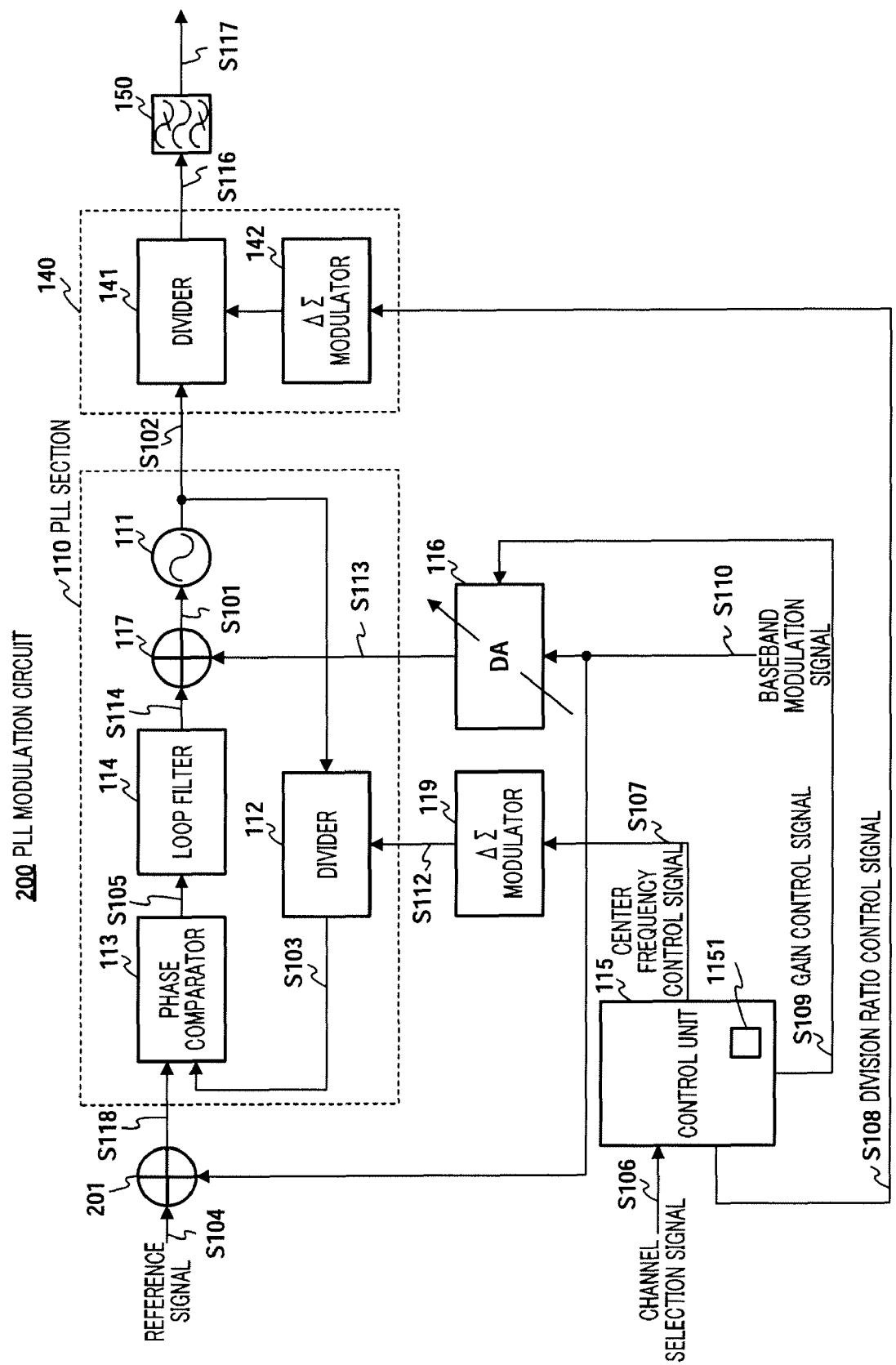
FIG. 10 is a block diagram showing the configuration of a PLL modulation circuit according to Embodiment 2 of the present invention.

FIG. 10 is a block diagram showing the configuration of a PLL modulation circuit according to Embodiment 2 of the present invention. Configuration elements in Embodiment 2 of the present invention that are identical to those in Embodiment 1 of the present invention are assigned the same reference codes, and descriptions thereof are omitted.

As shown in FIG. 10, as compared with PLL modulation circuit 100 according to Embodiment 1 of the present invention, in PLL modulation circuit 200 according to Embodiment 2 of the present invention adder 118 has been eliminated and adder 201 has been added.

That is to say, PLL modulation circuit 200 has PLL section 110, fractional divider section 140, and band-pass filter 150. PLL section 110 has voltage controlled oscillator 111, divider 112, phase comparator 113, and loop filter 114.

PLL modulation circuit 200 also has control unit 115, DA converter (DAC) 116, adder 117, adder 201, and delta-sigma modulator 119.

Next, operation of PLL modulation circuit 200 of Embodiment 2 of the present invention differing from that of Embodiment 1 of the present invention will be described in detail with reference to the accompanying drawings.

Control unit 115 supplies center frequency control signal S107 to delta-sigma modulator 119. Baseband modulation signal S110 from outside is supplied to adder 201.

Adder 201 adds together the value of reference signal S104 and the value of baseband modulation signal S110 and generates modulation reference signal S118, and supplies this signal to phase comparator 113. Phase comparator 113 compares the phase of modulation reference signal S118 from adder 201 with the phase of divider 112 output signal S103, and outputs output signal S105 in accordance with the phase difference.

Embodiment 2 of the present invention has the same effect as Embodiment 1 of the present invention.

Embodiment 3

Next, Embodiment 3 of the present invention will be described in detail with reference to the accompanying drawings.

Figure 11:
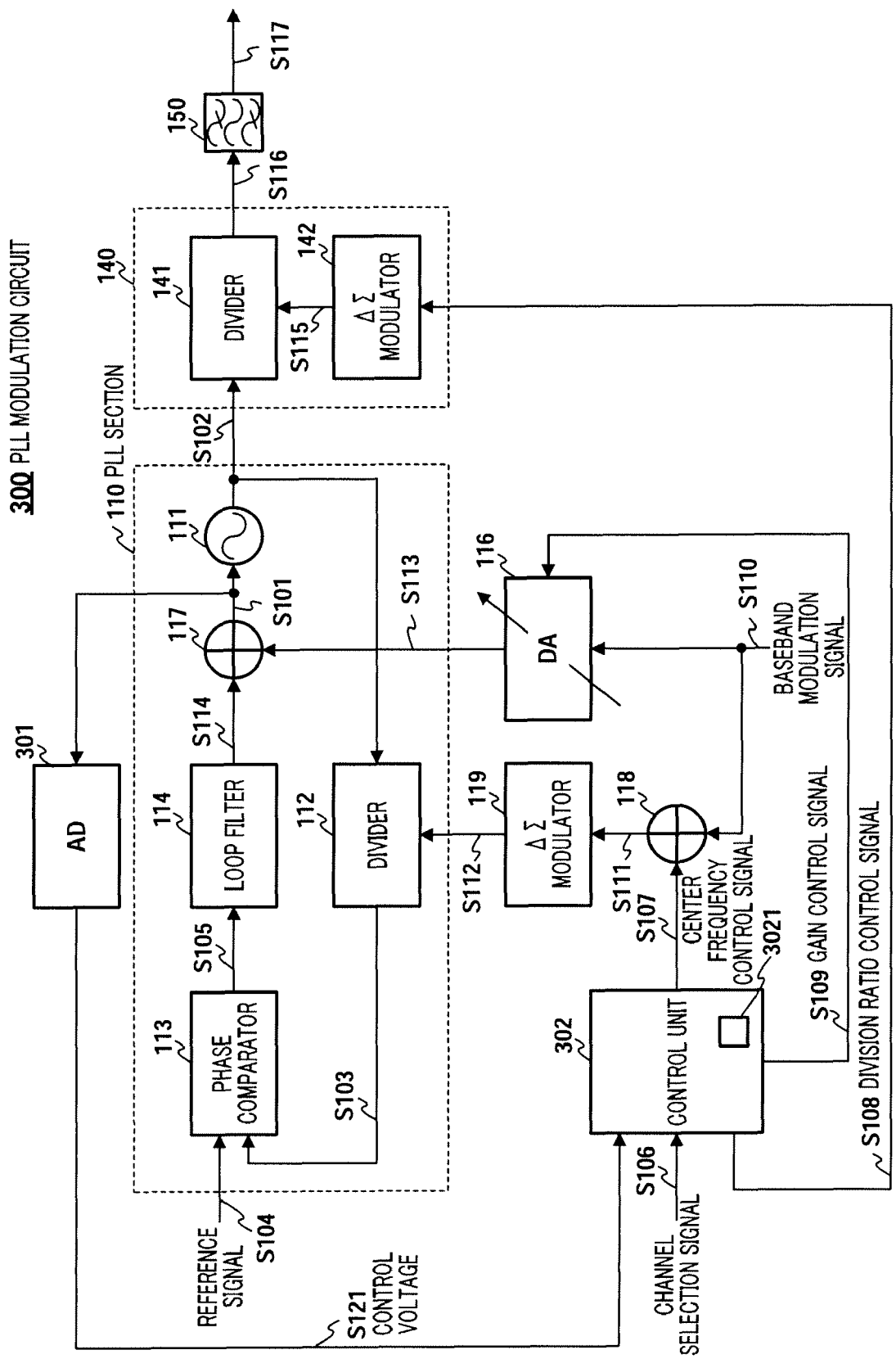
FIG. 11 is a block diagram showing the configuration of a PLL modulation circuit according to Embodiment 3 of the present invention.
Figure 12:
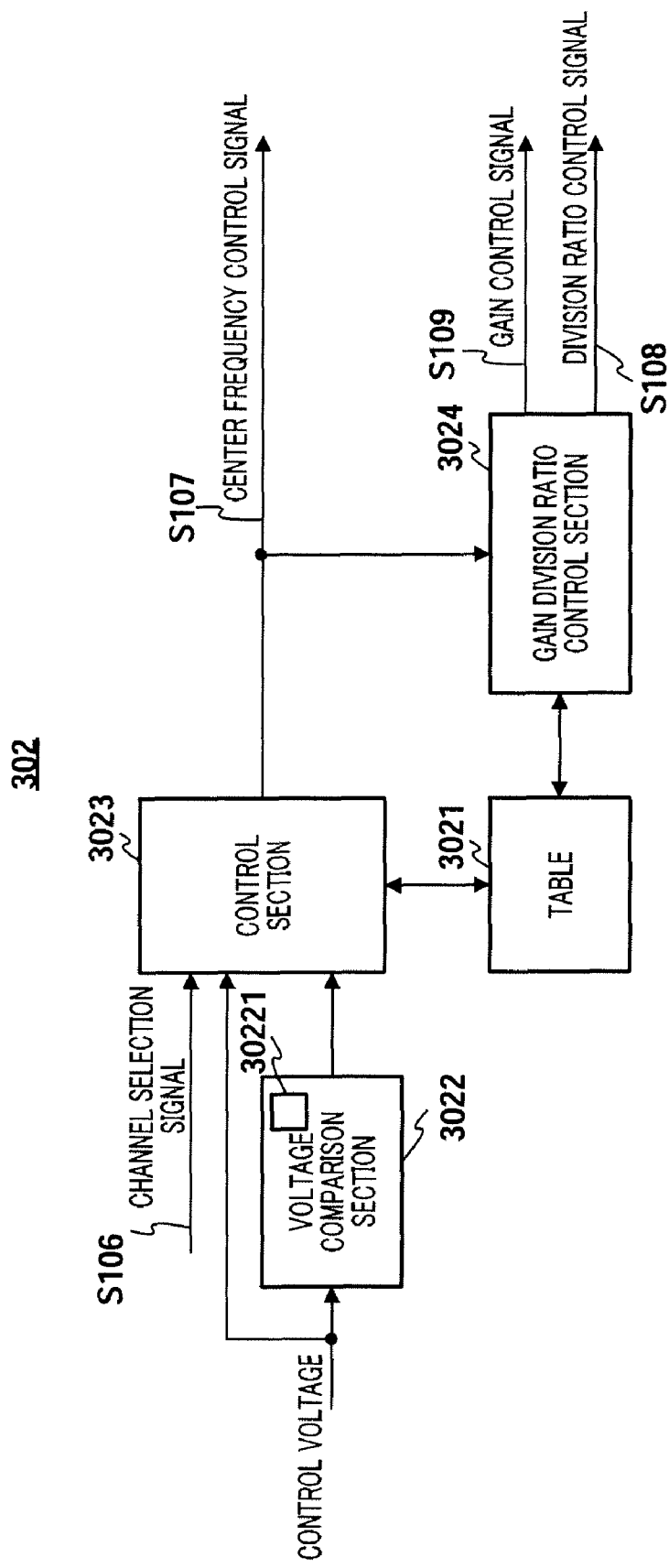
FIG. 12 is a block diagram showing the configuration of the control unit of a PLL modulation circuit according to Embodiment 3.

FIG. 11 is a block diagram showing the configuration of a PLL modulation circuit according to Embodiment 3 of the present invention. FIG. 12 is a block diagram showing the configuration of the control unit of a PLL modulation circuit according to Embodiment 3 of the present invention. Configuration elements in Embodiment 3 of the present invention that are identical to those in Embodiment 1 of the present invention are assigned the same reference codes, and descriptions thereof are omitted.

As shown in FIG. 11, as compared with PLL modulation circuit 100 according to Embodiment 1 of the present invention, in PLL modulation circuit 300 according to Embodiment 3 of the present invention AD converter 301 has been added and control unit 115 has been replaced by control unit 302.

That is to say, PLL modulation circuit 300 has PLL section 110, fractional divider section 140, and band-pass filter 150. PLL section 110 has voltage controlled oscillator 111, divider 112, phase comparator 113, and loop filter 114.

PLL modulation circuit 300 also has AD converter 301, control unit 302, DA converter (DAC) 116, adder 117, adder 118, and delta-sigma modulator 119.

As shown in FIG. 12, control unit 302 has table 3021, voltage comparison section 3022, control section 3023, and gain division ratio control section 3024.

As shown in FIG. 13, table 3021 stores center frequency control signal S107, division ratio control signal S108, and gain control signal S109, corresponding to channel selection signal S106 and digital control voltage S121 from AD converter 301.

Next, operation of PLL modulation circuit 300 according to Embodiment 3 of the present invention differing from that of Embodiment 1 of the present invention will be described in detail with reference to the accompanying drawings.

AD converter 301 receives analog control voltage S101 from voltage controlled oscillator 111, performs AD conversion and generates digital control voltage S121, and supplies this to voltage comparison section 3022 of control unit 302.

Voltage comparison section 3022 has memory apparatus 30221 that stores $VL_{MIN}$ and $VL_{MAX}$. Voltage comparison section 3022 compares control voltage S121 from AD converter 301 with $VL_{MIN}$ and $VL_{MAX}$ of memory apparatus 30221 and generates a voltage comparison result, and supplies this voltage comparison result to control section 3023.

When the voltage comparison result of voltage comparison section 3022 shows that control voltage S121 is smaller than $VL_{MIN}$, or that control voltage S121 is larger than $VL_{MAX}$, control section 3023 and gain division ratio control section 3024 execute an operation that adds or subtracts a predetermined voltage to/from current control voltage S101.

Control section 3023 receives channel selection signal S106, control voltage S121, and the voltage comparison result, searches table 3021 based on channel selection signal S106 and control voltage S121, and generates center frequency control signal S107 corresponding to that channel selection signal S106 and that control voltage S121. Control section 3023 supplies center frequency control signal S107 to gain division ratio control section 3024 and adder 118.

Gain division ratio control section 3024 searches table 3021 based on center frequency control signal S107 from control section 3023, and generates division ratio control signal S108 and gain control signal S109 corresponding to that center frequency control signal S107. Gain division ratio control section 3024 supplies division ratio control signal S108 to fractional divider section 140, and supplies gain control signal S109 to DA converter 116.

Figure 14:
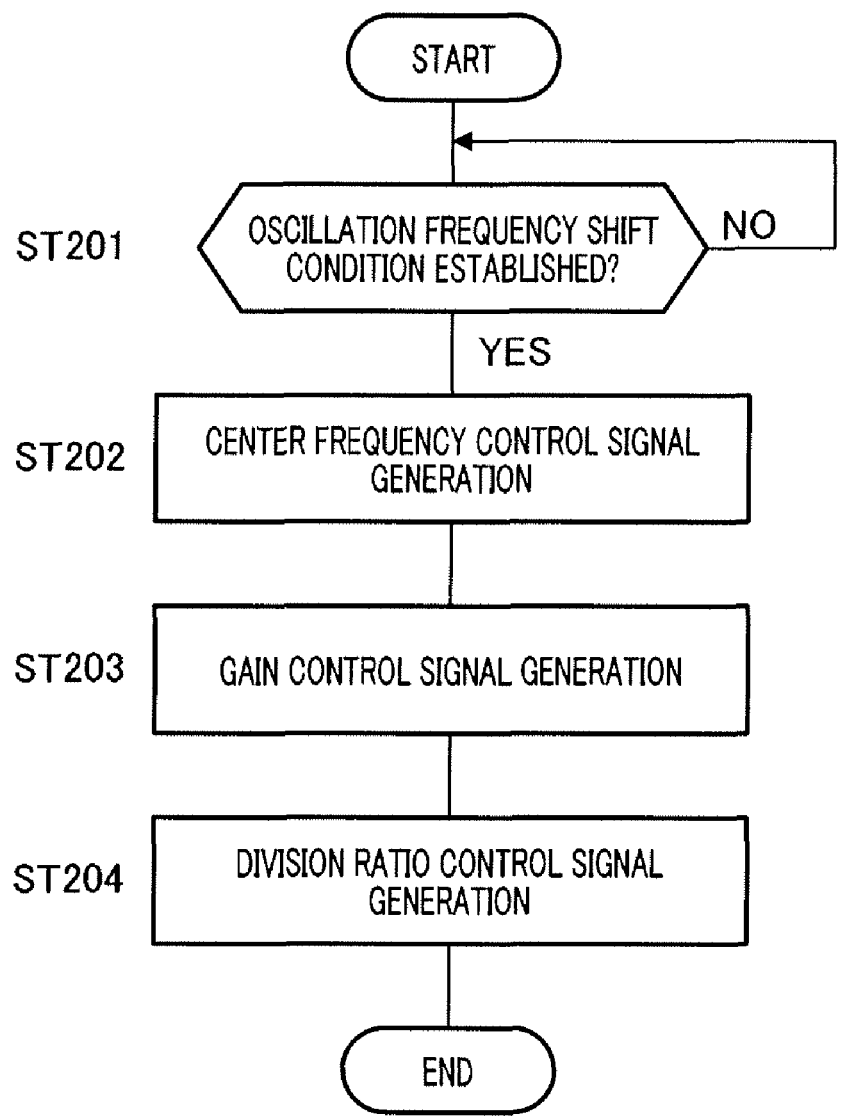
FIG. 14 is a flowchart for explaining the operation of a PLL modulation circuit according to Embodiment 3.

Next, the operation of control unit 302 of PLL modulation circuit 300 according to Embodiment 3 of the present invention will be described with reference to FIG. 14. FIG. 14 is a flowchart for explaining the operation of control unit 302 of PLL modulation circuit 300 according to Embodiment 3 of the present invention.

In step ST201, voltage comparison section 3022 determines whether or not an oscillation frequency shift condition is established, and generates a voltage comparison result. If this voltage comparison result shows that control voltage S121 is smaller than $VL_{MIN}$, or that control voltage S121 is larger than $VL_{MAX}$, an oscillation frequency shift condition is deemed to have been established.

If an oscillation frequency shift condition is established in step ST201, control section 3023 generates center frequency control signal S107, gain control signal S109, and division ratio control signal S108 (step ST202, step ST203, step ST204) based on channel selection signal S106 and control voltage S121, and supplies these generated signals to adder 118, DA converter 116, and fractional divider section 140, respectively.

Embodiment 3 of the present invention can be applied to Embodiment 2 of the present invention. That is to say, Embodiment 3 of the present invention may be configured by adding AD converter 301 to PLL modulation circuit 200 according to Embodiment 2 of the present invention shown in FIG. 10, and replacing control unit 115 by control unit 302.

According to Embodiment 3 of the present invention, the influence of nonlinearity of a control voltage-frequency characteristic line in a voltage controlled oscillator can be avoided, enabling modulation accuracy to be maintained for wideband modulation.

Also, since Embodiment 3 of the present invention has a table that stores beforehand a channel selection signal and control voltage input to the voltage controlled oscillator, and a center frequency control signal, gain control signal, and division ratio control signal corresponding to that channel selection signal and that control voltage, a control operation is speedy.

Furthermore, since Embodiment 3 of the present invention has a control voltage detection section that detects a control voltage input to the voltage controlled oscillator and generates a control voltage detection value, and a voltage comparison section that compares the control voltage detection value with a predetermined first reference voltage value and second reference voltage value, whether the control voltage-frequency characteristic line in the voltage controlled oscillator output signal has linearity can be monitored constantly, making more dynamic compensation operation possible.

Embodiment 4

Next, Embodiment 4 of the present invention will be described in detail with reference to the accompanying drawings.

Figure 15:
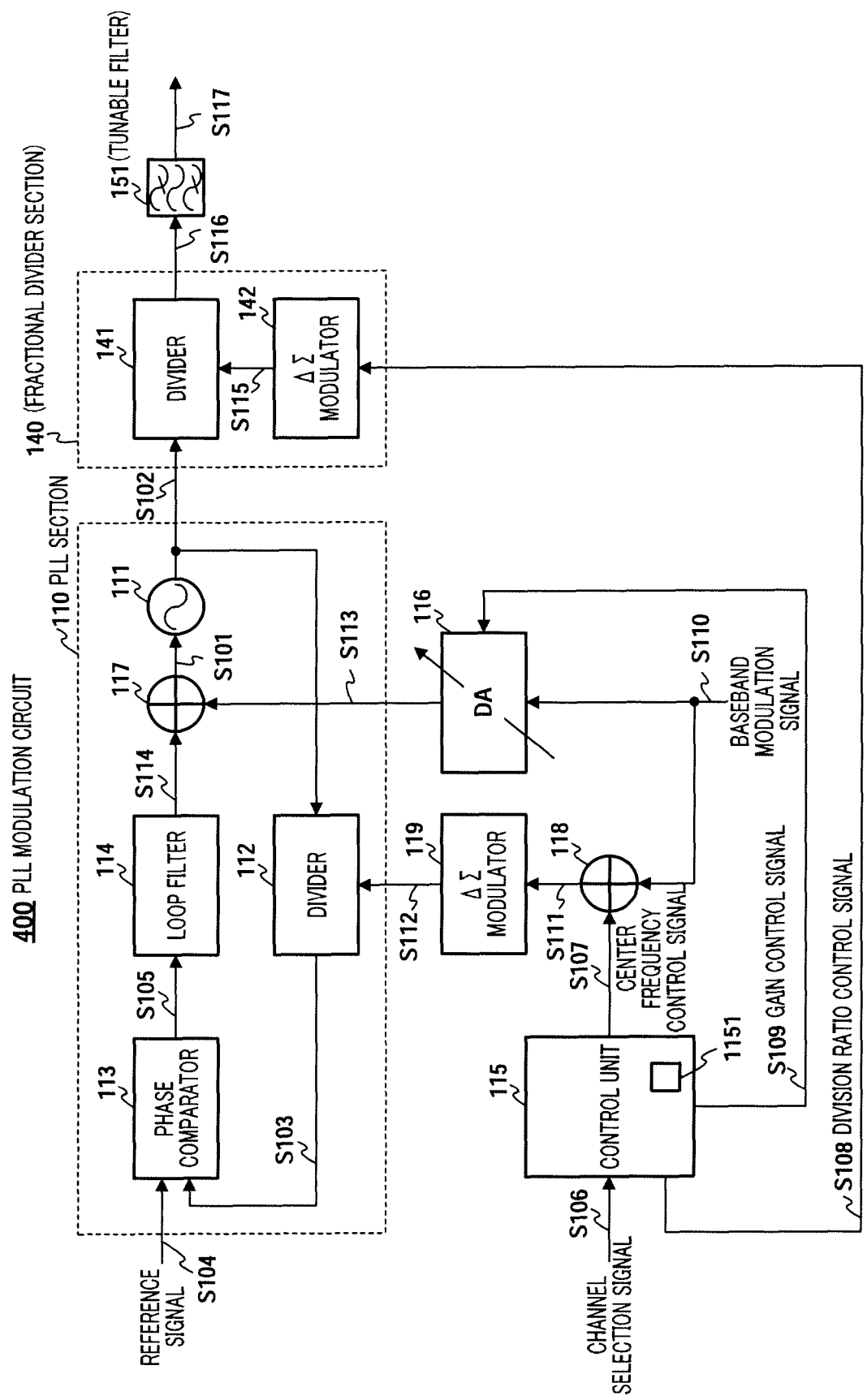
FIG. 15 is a block diagram showing the configuration of a PLL modulation circuit according to Embodiment 4 of the present invention.

FIG. 15 is a block diagram showing the configuration of a PLL modulation circuit according to Embodiment 4 of the present invention. Configuration elements in Embodiment 4 of the present invention that are identical to those in Embodiment 1 of the present invention are assigned the same reference codes, and descriptions thereof are omitted.

As shown in FIG. 15, as compared with PLL modulation circuit 100 according to Embodiment 1 of the present invention, in PLL modulation circuit 400 according to Embodiment 4 of the present invention band-pass filter 150 has been replaced by tunable filter 151.

Embodiment 4 of the present invention has the same effect as Embodiment 1 of the present invention.

Embodiment 5

Next, Embodiment 5 of the present invention will be described in detail with reference to the accompanying drawings.

Figure 16:
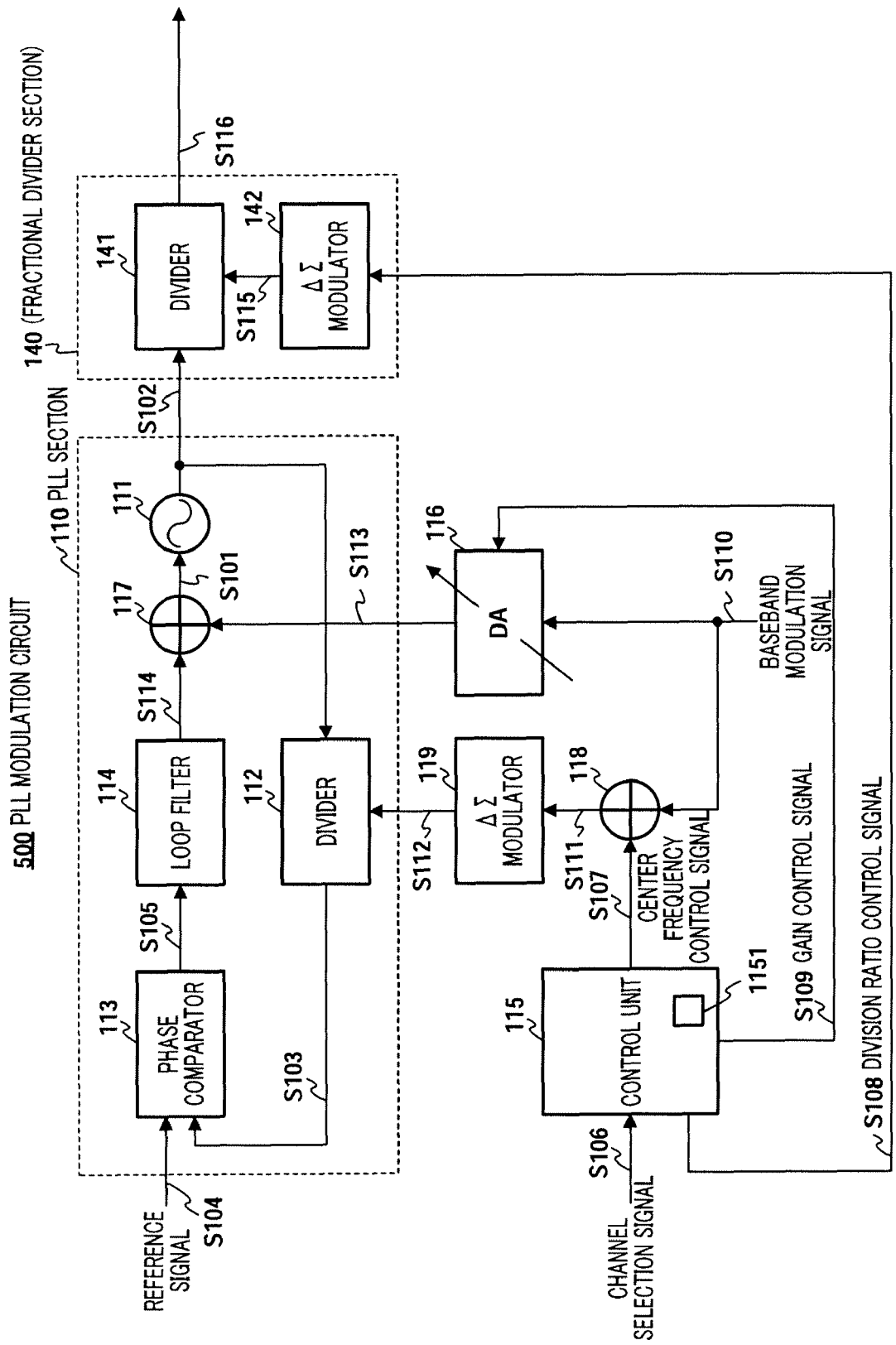
FIG. 16 is a block diagram showing the configuration of a PLL modulation circuit according to Embodiment 5 of the present invention.

FIG. 16 is a block diagram showing the configuration of a PLL modulation circuit according to Embodiment 5 of the present invention. Configuration elements in Embodiment 5 of the present invention that are identical to those in Embodiment 1 of the present invention are assigned the same reference codes, and descriptions thereof are omitted.

As shown in FIG. 16, as compared with PLL modulation circuit 100 according to Embodiment 1 of the present invention, in PLL modulation circuit 500 according to Embodiment 5 of the present invention band-pass filter 150 has been eliminated.

As Embodiment 5 of the present invention has a configuration that does not include a filter due to the applied type of communication system or PLL modulation circuit noise characteristics, implementation is possible with a simple configuration in which the circuit scale has been reduced.

Embodiment 6

Next, Embodiment 6 of the present invention will be described in detail with reference to the accompanying drawings.

Figure 17:
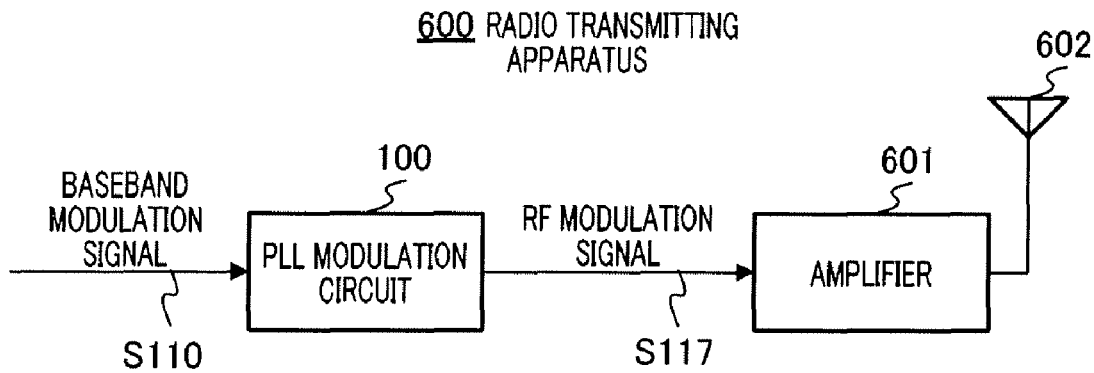
FIG. 17 is a block diagram showing the configuration of a radio transmitting apparatus according to Embodiment 6 of the present invention.

FIG. 17 is a block diagram showing the configuration of a radio transmitting apparatus according to Embodiment 6 of the present invention.

As shown in FIG. 17, radio transmitting apparatus 600 according to Embodiment 6 of the present invention uses PLL modulation circuit 100 according to above-described Embodiment 1, and has amplifier 601 that amplifies an RF modulation signal obtained by this PLL modulation circuit 100, and antenna 602 that transmits an amplified signal.

Use of the above configuration makes it possible to implement a radio transmitting apparatus that maintains modulation accuracy for wideband modulation, and enables a high-quality transmit signal of high modulation accuracy to be transmitted from a base station or the like, for example.

Radio transmitting apparatus 600 according to Embodiment 6 of the present invention may also be configured with PLL modulation circuit 200, PLL modulation circuit 300, PLL modulation circuit 400, or PLL modulation circuit 500 provided instead of PLL modulation circuit 100.

Embodiment 7

Next, Embodiment 7 of the present invention will be described in detail with reference to the accompanying drawings.

Figure 18:
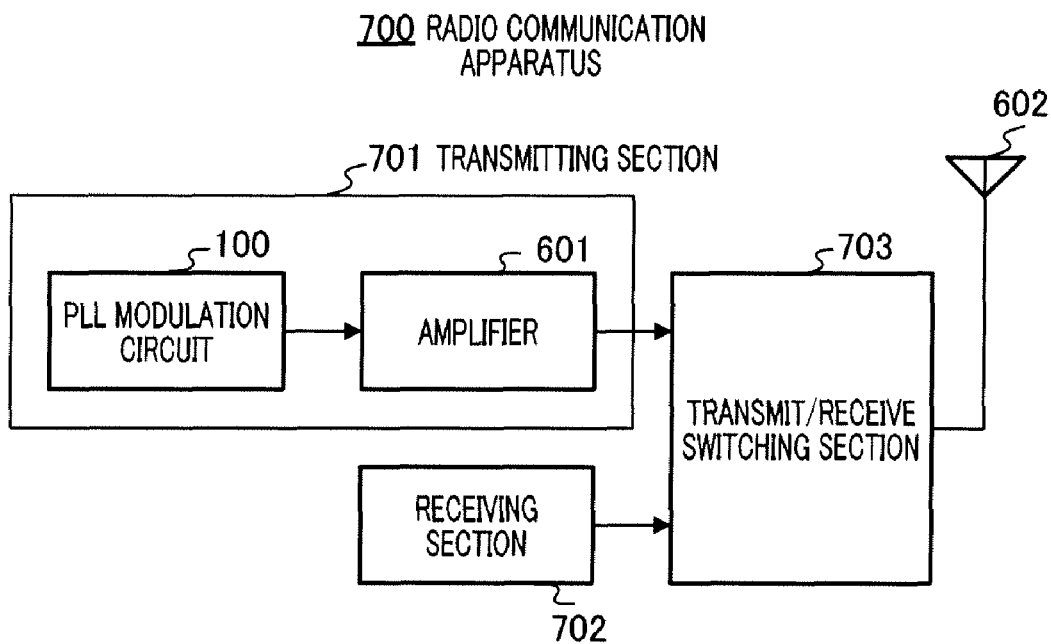
FIG. 18 is a block diagram showing the configuration of a radio communication apparatus according to Embodiment 7 of the present invention.

FIG. 18 is a block diagram showing the configuration of a radio communication apparatus according to Embodiment 7 of the present invention.

As shown in FIG. 18, radio communication apparatus 700 according to Embodiment 7 of the present invention has transmitting section 701 having above PLL modulation circuit 100 according to Embodiment 1 and amplifier 601, receiving section 702 that executes predetermined reception processing including demodulation processing on a received signal, transmit/receive switching section 703 that switches between a transmit signal and a received signal, and antenna 602.

Use of the above configuration makes it possible to implement a radio communication apparatus that maintains modulation accuracy for wideband modulation, and enables high-quality transmit signals and received signals of high modulation accuracy to be transmitted and received. Therefore, if this configuration is applied to a mobile phone, for example, high-quality call transmission and reception is possible, and user convenience is improved.

Radio communication apparatus 700 according to Embodiment 7 of the present invention may also be configured with PLL modulation circuit 200, PLL modulation circuit 300, PLL modulation circuit 400, or PLL modulation circuit 500 provided instead of PLL modulation circuit 100.

When a PLL modulation circuit of the present invention is applied to a multimode system, the control voltage range for which linearity can be guaranteed differs according to the modulation bandwidth of each communication specification mode, such as GSM, UMTS, and so forth, and therefore to handle such a case, a PLL modulation circuit of the present invention may generate a switching control signal in accordance with the mode, and store data corresponding to the specifications of the respective modes.

Delta-sigma modulator 142 in Embodiments 1, 2, 3, 4, and 5 of the present invention is provided for generation of the division ratio of divider 141, and an equivalent generation function may be provided inside control unit 115 or 302.

A channel selection signal and reference signal in Embodiments 1, 2, 3, 4, and 5 of the present invention are output from a control section not shown in the drawings. This channel selection signal and reference signal may be output by separate control sections, or may be output by a single control section for controlling a wideband modulation PLL. Furthermore, when such a wideband modulation PLL is applied to a mobile terminal apparatus or a radio communication apparatus of a radio base station or the like, a channel selection signal and reference signal may be generated by a control section that controls the operation of the mobile terminal apparatus or radio communication apparatus.

While various embodiments have been described above, the present invention is not limited to the configurations of Embodiments 1, 2, 3, 4, and 5. For example, DA converter 116 gain adjustment may be performed by either a digital signal or an analog signal. Also, for control units 115 and 302, it has been assumed that a center frequency control signal, division ratio control signal, and gain control signal corresponding to a channel selection signal and control voltage are stored beforehand, but these numeric values may also be found by means of calculations each time using the method shown in the description of the embodiment.

The disclosures of Japanese Patent Application No. 2006-011707, filed on Jan. 19, 2006, and Japanese Patent Application No. 2007-6364, filed on Jan. 15, 2007, including the specifications, drawings and abstracts, are incorporated herein by reference in their entirety.

INDUSTRIAL APPLICABILITY

The present invention has an effect of enabling modulation accuracy to be maintained for wideband modulation, and is useful for a PLL modulation circuit, radio transmitting apparatus, radio communication apparatus, and so forth.

The invention claimed is:

1. A PLL modulation circuit comprising: a PLL section that includes a voltage controlled oscillator, a first divider that divides an output signal of the voltage controlled oscillator, a phase comparator that compares a phase of an output signal of the first divider with a phase of a reference signal, and a loop filter that smoothes an output signal of the phase comparator; a first modulation signal input section that inputs a first modulation signal to the first divider or the phase comparator as a first input location of the PLL section; a second modulation signal input section that performs DA conversion of a digital modulation signal with a DA converter and generates an analog second modulation signal, and inputs that analog second modulation signal to the voltage controlled oscillator as a second input location of the PLL section; a second divider that divides the output signal of the voltage controlled oscillator; and a control section that generates a center frequency control signal, a gain control signal, and a division ratio control signal for the second divider based on an input channel selection signal and control voltage, supplies the center frequency control signal to the first divider, supplies the gain control signal to the DA converter, and supplies the division ratio control signal to the second divider.

2. A PLL modulation circuit comprising: a PLL section that includes a voltage controlled oscillator, a first divider that divides an output signal of the voltage controlled oscillator, a phase comparator that compares a phase of an output signal of the first divider with a phase of a reference signal, and a loop filter that smoothes an output signal of the phase comparator; a first modulation signal input section that inputs a first modulation signal to the first divider or the phase comparator as a first input location of the PLL section; a second modulation signal input section that performs DA conversion of a digital modulation signal with a DA converter and generates an analog second modulation signal, and inputs that analog second modulation signal to the voltage controlled oscillator as a second input location of the PLL section; a second divider that divides the output signal of the voltage controlled oscillator; and a control section that has a table storing beforehand an input channel selection signal and control voltage, and a center frequency control signal, a gain control signal, and a division ratio control signal for the second divider corresponding to that channel selection signal and that control voltage, searches the table based on the channel selection signal and the control voltage input to the voltage controlled oscillator and generates the center frequency control signal, the gain control signal, and the division ratio control signal, supplies the center frequency control signal to the first divider, supplies the gain control signal to the DA converter, and supplies the division ratio control signal to the second divider.

3. A PLL modulation circuit comprising: a PLL section that includes a voltage controlled oscillator, a first divider that divides an output signal of the voltage controlled oscillator, a phase comparator that compares a phase of an output signal of the first divider with a phase of a reference signal, and a loop filter that smoothes an output signal of the phase comparator; a first modulation signal input section that inputs a first modulation signal to the first divider or the phase comparator as a first input location of the PLL section; a control voltage detection section that detects an input control voltage and generates a control voltage detection value; a voltage comparison section that compares the control voltage detection value with a predetermined first reference voltage value and second reference voltage value and generates a voltage comparison result; a second modulation signal input section that performs DA conversion of a digital modulation signal with a DA converter and generates an analog second modulation signal, and inputs that analog second modulation signal to the voltage controlled oscillator as a second input location of the PLL section; a second divider that divides the output signal of the voltage controlled oscillator; and a control section that has a table storing beforehand an input channel selection signal and control voltage, and a center frequency control signal, a gain control signal, and a division ratio control signal for the second divider corresponding to that channel selection signal and that control voltage, searches the table based on the channel selection signal and the control voltage input to the voltage controlled oscillator and the voltage comparison result and generates the center frequency control signal, the gain control signal, and the division ratio control signal, supplies the center frequency control signal to the first divider, supplies the gain control signal to the DA converter, and supplies the division ratio control signal to the second divider.

4. A radio transmitting apparatus comprising:
the PLL modulation circuit according to claim 1; and
an amplifier that amplifies an RF modulation signal output from the PLL modulation circuit.

5. A radio communication apparatus comprising:
a transmitting section that has the PLL modulation circuit according to claim 1;
a receiving section that demodulates a received signal;
an antenna; and
a transmit/receive switching section that switches between supply of a transmit signal from the transmitting section to the antenna and supply of a received signal from the antenna to the receiving section.

* * * * *